United States Patent
Johansson et al.

(10) Patent No.: US 6,794,040 B2
(45) Date of Patent: Sep. 21, 2004

(54) FLOWABLE COMPOSITIONS AND USE IN FILLING VIAS AND PLATED THROUGH-HOLES

(75) Inventors: Gary Alan Johansson, New Castle, DE (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/211,329

(22) Filed: Aug. 5, 2002

(65) Prior Publication Data

US 2003/0064212 A1 Apr. 3, 2003

Related U.S. Application Data

(62) Division of application No. 09/544,114, filed on Apr. 6, 2000, now Pat. No. 6,427,325, which is a division of application No. 09/145,191, filed on Sep. 1, 1998, now Pat. No. 6,090,474.

(51) Int. Cl.$^7$ .............................................. B32B 27/38
(52) U.S. Cl. .......................... 428/413; 522/49; 522/60; 522/61; 522/64; 522/65
(58) Field of Search ......................... 428/413; 522/49, 522/60, 61, 64, 65

(56) References Cited

U.S. PATENT DOCUMENTS

| | | | |
|---|---|---|---|
| 4,045,516 A | 8/1977 | Morgan | 260/886 |
| 4,566,186 A | 1/1986 | Bauer | 29/852 |
| 4,911,796 A | 3/1990 | Reed | 204/15 |
| 4,927,733 A | 5/1990 | Stout | 430/256 |
| 4,992,354 A | 2/1991 | Axon et al. | 430/258 |
| 5,047,442 A | 9/1991 | Sasaki | 522/27 |
| 5,081,164 A | 1/1992 | Lai | 522/77 |
| 5,102,970 A | 4/1992 | Wang | 528/98 |
| 5,208,068 A | 5/1993 | Davis | 427/97 |
| 5,288,589 A | 2/1994 | McKeever et al. | 430/262 |
| 5,356,755 A | 10/1994 | Matsuda | 430/313 |
| 5,487,218 A | 1/1996 | Bhatt | 29/852 |
| 5,523,383 A | 6/1996 | Ikeda | 528/345 |
| 5,539,012 A * | 7/1996 | Klemarczyk et al. | 522/13 |
| 5,557,844 A | 9/1996 | Bhatt | 29/852 |
| 5,603,158 A | 2/1997 | Murata | 29/846 |
| 5,721,088 A | 2/1998 | Martin | 430/270 |
| 5,887,345 A | 3/1999 | Kulesza et al. | |
| 6,190,759 B1 | 2/2001 | Johansson et al. | |

FOREIGN PATENT DOCUMENTS

| | | |
|---|---|---|
| JP | 60-175494 | 9/1985 |
| JP | 63-005592 | 1/1988 |
| JP | 63-124597 | 5/1988 |
| JP | 03050887 A | 3/1991 |
| JP | 05-198929 | 8/1993 |
| JP | 6-275959 | 9/1994 |
| JP | 06-275959 | 9/1994 |
| JP | 7-22754 | 1/1995 |
| JP | 07-086727 | 3/1995 |
| JP | 08-037358 | 2/1996 |
| JP | 08-054732 | 2/1996 |
| JP | 09-018141 | 1/1997 |
| JP | 09-136957 | 5/1997 |

* cited by examiner

*Primary Examiner*—Philip Tucker
*Assistant Examiner*—D. Aylward
(74) *Attorney, Agent, or Firm*—Connolly, Bove, Lodge & Hutz LLP

(57) ABSTRACT

A printed circuit board or card having plated through-holes is provided wherein plated through-holes are filled with a photocured polymerized composition. Also, a method for fabricating these printed circuit boards or cards is provided. Also provided are compositions and methods of providing carrier films coated with the compositions for use in filling vias or plated through-holes.

22 Claims, No Drawings

FLOWABLE COMPOSITIONS AND USE IN FILLING VIAS AND PLATED THROUGH-HOLES

CROSS REFERENCE TO RELATED APPLICATIONS

This Application is a divisional of U.S. patent Ser. No. 09/544,114, filed Apr. 6, 2000, which issued as U.S. Pat. No. 6,427,325, which is a divisional application of U.S. patent application Ser. No. 09/145,191 filed Sep. 1, 1998, which issued as U.S. Pat. No. 6,090,474.

TECHNICAL FIELD

The present invention is concerned with a printed circuit board or card or chip caffier having plated through-holes wherein all or selected through-holes less than all of the through-holes are filled. In addition, the present invention is concerned with a method for filling all or selected ones of plated through-holes in a printed circuit board or card. The present invention overcomes the problem experienced in the prior art of resin bleed-out during filling of the plated through-holes. The present invention also relates to flowable compositions suitable for filling vias and plated through-holes.

BACKGROUND OF INVENTION

Increasing levels of integration of integrated circuit chips reduces the chip count of a functional circuit, while significantly increasing the I/O count of the individual integrated circuits making up the functional circuit. This drive for increased circuit and component density in the individual integrated circuit chips leads to a parallel drive for increased circuit and component density in the printed circuit boards carrying the chips and in the assemblies using them.

The increased circuit and component density in the printed circuit boards makes the ability to locate either solder surface mount components or place additional circuitry layers directly above plated through-holes highly desirable. This is especially the case when the density of the plated through-holes required to service the I/Os of the surface mount components is such that there is no surface area available for attachment pads interstitial to the plated through-hole grid.

This problem is especially severe with fine pitch ball grid array components (BGA) and flip chip attach (FCA) integrated circuits. Soldering of the surface mount components to the surface pads, i.e., LANs of conventional plated through-holes is highly undesirable. This is because the solder used for assembly tends to wick down into the plated through-holes. The result is low volume, unreliable solder joints.

One solution to this problem that has been proposed is filling the plated through-holes with a solid material, and if the fill material is not electrically conductive or not solderable, then to coat the surface of the filled hole with a conductive, solderable material such as by overplating. Compositions that have been suggested as the plated through-hole fill material have been selected based on certain criteria. In particular, it is desirable that the material have chemical and thermal compatibility with the printed circuit board fabrication processes and materials and particularly compatibility with the various plating baths employed. Also, the material should exhibit sufficient flow characteristics in order to fill small, high aspect ratio plated through-holes and have the ability to be transformed or converted into a solid material, with a minimal volume change after filling. The thermal expansion of the composition should be compatible with the rest of the printed circuit board structure. Furthermore, the composition should exhibit good adhesion to the metallization within the barrel of the plated through-holes.

One particular class of materials which can be formulated to meet the above criteria is the class of thermosetting resins filled with inorganic powders, and especially epoxy resin compositions of the same type used to fabricate the epoxy/glass prepregs used for printed circuit board construction, filled with metal powders such as copper.

The plated through holes could be filled by dispensing the fill material from a syringe, through a needle, into the holes. However, this procedure is rather time consuming and expensive and therefore not especially desirable from a commercial viewpoint. A method for mass filling of plated through-holes such as using a squeegee to force the fill material into the plated through-holes is difficult to carry out and to achieve complete fill of especially high aspect ratio holes. Furthermore, there exists a significant number of missed holes when filling with a stencil or screening and appreciable amount of surface or internal voids occurs.

A further problem also occurs, if it is desired to have both filled and unfilled plated through-holes on the same printed circuit board. It has been suggested to fill only selected plated through-holes by drilling holes in the mask sheet only in positions corresponding to the plated through-holes to be filled, leaving the plated through-holes to be unfilled blocked during the fill operation. The problem experienced however is that the fill material, which bleeds under the mask, can also bleed into plated through-holes which are to remain clear. This would not be a major concern if component leads or pins were not required to be inserted into the plated through-holes. However, the reason for requiring plated through-holes to be unfilled is to permit such assertion, and soldering of the pin/leads is also usually required. The film material which bleeds into pin-in-hole (PIH) plated through-holes will interfere with solder wetting in the barrel of the plated through-hole and could possibly constrict the diameter of the holes sufficiently to prevent the lead insertion.

A suggested process of selective drilling and filling involves the drilling and plating only of the plated through-holes to be filled before applying the hole fill process. The unfilled plated through-holes are drilled after filling, either before or after the nub and bleed remove operation. However, the processes used for overplating the plugs and the filled plated through-holes will also plate the barrels of the newly drilled, unfilled holes.

It would also be desirable to provide a process for selective plated through-hole filling whereby the solderability and cleanliness of the unfilled plated through-hole barrels is not compromised.

SUMMARY OF INVENTION

The present invention provides for filling all or selective ones of plated through-holes in a printed circuit board or card while leaving other plated through-holes unfilled. The present invention overcomes the prior art problems discussed above of resin bleed along the surface of the circuit boards. Also, the present invention provides for assuring that the cleanliness or solderability of the unfilled plated through-hole barrels, when present, is not compromised. Accordingly, the present invention eliminates the problems caused by resin bleed during hole fill, thereby resulting in a more useful printed circuit board. The present invention provides for making pad-in-via surface mount circuit boards and surface laminar carrier (SLC) technology printed circuit boards that provide higher routing density than competing technologies, therefor providing higher density printed circuit boards and assemblies.

More particularly, the present invention is concerned with a printed circuit board, card or chip carrier having a plurality of plated through-holes. All or selected ones of the plated through-holes are filled with a photocured polymerized composition. When only selected through-holes are filled, the remaining plated through-holes remain unfilled.

The present invention is also related to a method for filling all or selected ones of plated through-holes in a printed circuit board, card or chip carrier. The method of the present invention includes providing a layer of a photocurable polymerizable composition onto a carrier. The carrier with the layer of the photocurable polymerizable composition facing the plated through-holes is placed onto the printed circuit board or card. The carrier is then vacuum laminated to the printed circuit board or card, thereby causing the photocurable polymerizable composition to flow into the plated through-holes. The photocurable polymerizable composition is then imagewise exposed to actinic radiation through a photomask which allows the radiation to impinge upon all or only those plated through-holes which are to be filled. The polymerizable composition is developed with a solvent to remove the unexposed portion of the polymerizable composition.

In addition, the present invention is concerned with products obtained by the above-disclosed process.

The present invention also relates to certain preferred compositions suitable for filling vias. The preferred composition exhibit dual curing characteristics. Preferred hole fill resin compositions that exhibit dual curing characteristics according to the present invention comprise:

1) a resin component comprising:
   a. an epoxy component including at least one polyepoxide resin curable by heat;
   b. an olefinically unsaturated monomer component including at least one polyolefinically unsaturated monomer curable by actinic radiation;
   c. at least one cyanate ester; and
   d. a flexibilizer;
2) at least one cationic or free radical photoinitiator;
3) at least one organic peroxide;
4) at least one heat activated curing agent being selected from the group consisting of organo-metal compounds, inorganic metal salts, phenolic compounds, solutions of organo-metal compounds in phenolic compounds and mixtures thereof; and
5) at least an inorganic filler for CTE control.

The present invention also relates to a carrier film provided with a layer of the above composition.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

According to the present invention, a carrier film is provided with a layer of a flowable photocurable polymerizable composition. The photocurable composition is a cationically curable composition or a free radical polymerizable composition. Examples of suitable photocurable compositions are photosensitive epoxy polymer compositions, photosensitive curable cyanate ester compositions, photosensitive acrylate polymer compositions and photosensitive methacrylate polymer compositions or combinations thereof.

Suitable cyanate ester components include at least one cyanate ester compound (monomer, oligomer, or polymer). Preferably, the cyanate ester component comprises at least one cyanate ester compound (monomer, oligomer, or polymer). More preferably, the cyanate ester component comprises at least one compound having two or more —OCN functional groups per molecule. The molecular weights of suitable cyanate ester compounds are typically about 150 to about 2000. The cyanate ester component preferably includes one or more cyanate ester compounds according to Formula I, II or III.

Formula I is $$Z(-OCN)_q \qquad (I)$$

wherein q can be an integer from 2 to 7 and wherein Z comprises at least one of: (1) a mono-, di-, tri-, or tetrasubstituted aromatic hydrocarbon containing 5 to 30 carbon atoms, and (2) a mono-, di-, tri-, or tetrasubstituted aliphatic hydrocarbon containing 7 to 20 carbon atoms. Optionally, (1) and (2) may contain 1 to 10 heteroatoms selected from the group consisting of non-peroxidic oxygen, sulfur, non-phosphino phosphorous, non-amino nitrogen, halogen, and silicon.

Formula II is

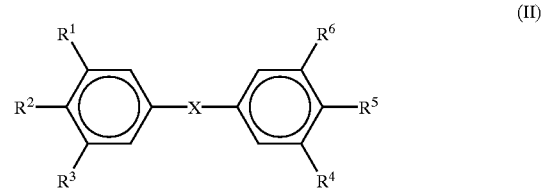

(II)

where X is a single bond, a $C_1$–$C_4$ alkylene group, —S—, or the —$SO_2$— group; and where $R^1$, $R^2$, $R^3$, $R^4$, $R^5$, and $R^6$ are independently —H, a $C_1$–$C_5$, alkyl group, or the cyanate ester group (—OCN), with at least two of $R^1$, $R^2$, $R^3$, $R^4$, $R^5$ and $R^6$ being the cyanate ester group. $R^1$, $R^2$, $R^3$, $R^4$, $R^5$ and $R^6$ are preferably —H—, —CH, or cyanate ester group.

Formula III is

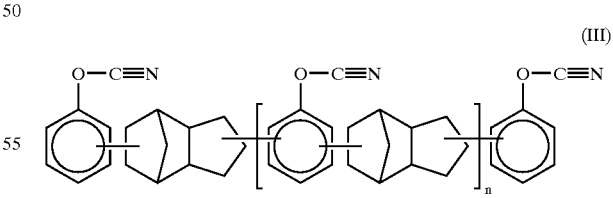

(III)

where n is 0 to 5.

The cyanate esters useful in the invention may typically be employed in amounts ranging from about 5% by wt. to about 95% wt. and more typically about 10% by wt. to about 50% by wt. based upon the total weight of the polymerizable components of the composition. The cyanate ester component may be present as a single cyanate ester, preferably having at least two —OCN functional groups per molecule, or as a mixture of cyanate esters, preferably including at least one dicyanate ester. Preferred cyanate esters useful in the present invention include the polyaromatic cyanate esters, such as the dicyanate esters of bisphenols. Especially preferred cyanate esters include the dicyanate esters of bisphenol A, such as the AroCy B-10 cyanate ester monomer, the dicyanate esters of tetramethylbisphenol F, such as AroCy M-10, and the dicyanate esters of bisphenol E, such as AroCy L-10, all available from Ciba. Alternatively, a semisolid dicyanate oligomer of bisphenol A may be employed in conjunction with a cyanate ester of lower viscosity. An especially preferred cyanate ester oligomer is the dicyanate oligomer of bisphenol A, such as the AroCy B-30 semisolid resin available from Ciba.

Epoxy resins suitable in the compositions of the present invention include polyepoxides curable by elevated temperature. Examples of these polyepoxides include polyglycidyl and poly-(b-methylglycidyl) ethers obtainable by reaction of a compound containing at least two free alcoholic hydroxyl and/or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,2-diol, butane-1,4-diol, poly(oxytetramethylene) glycols, pentane-1,5-diol, hexane-2,4,6-triol, glycerol, 1,1,1-trimethylolpropane, pentaerythritol, sorbitol, and poly(epichlorohydrin); from cycloaliphatic alcohols such as resorcinol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Also, they may be made from mononuclear phenols, such as resorcinol and hydroquinone, and from polynuclear phenols, such as bis(4-hydroxyphenyl)methane, 4,4-dihydroxydiphenyl, bis(4-hydroxyphenyl sulphone, 1,1,2,2-tetrabis(4-hydroxyphenyl)ethane, 2,2-bis(4-hydroxyphenyl)propane, 2,2-bis(3,5-dibromo-4-hydroxyphenyl)propane, and novolaks formed from the combination of aldehydes, such as formaldehyde, acetaldehyde, and furfuraldehyde, with phenols, such as phenol itself, and phenols substituted on the ring by chlorine atoms or by alkyl groups each containing up to nine carbon atoms such as 4-chlorophenol, 2-methylphenol, and 4-t-butylphenol.

Poly(N-glycidyl) compounds include, for example, those obtained by dehydrochlorination of the reaction products of epichlorohydrin with amines containing at least two amino hydrogen atoms, such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneureas, and of hydantoins such as 5,5-dimethylhydantoin.

Such epoxies are available from a variety of commercial sources, such as the Epon series from Shell Chemical Co., the Epirez series from Rhone-Poulenc, the Araldite series from Ciba and the DER series from Dow Chemical Co.

Also useful are halogenated epoxy resins such as the brominated epoxides available from the sources shown above. Halogenated epoxy resins in combination with other fire retardant materials may be suitable for use as fire retardant additives in the compositions of the present invention.

A suitable diglycidyl ether of bisphenol A is a tetrabromobisphenol A formerly available under the trade name "Epirez 5183" from High Tek Polymers, now available as "EPON 1183" from Shell Chemical Company.

Especially preferred epoxy resins useful in the present invention are the glycidyl ethers of bisphenol A marketed under the tradenames Epon 825 and Epon 828 available from Shell chemical Co., DER 331 and 332 available from Dow Chemical Co. and the cycloaliphatic epoxy resin marketed as ERL-4221 and ERL-4299 by Union Carbide Co.

A suitable octofunctional bisphenol A formerly available under the trade name "Epirez SU-8" from High Tek Polymers, is now available as "EPON SU8" from Shell Chemical Company.

Various epoxies such as the glycidyl ethers marketed as the EPODIL series by Pacific Anchor Chemical Corporation, a division of Air Products and Chemicals, Inc. may be added as epoxy diluents, to reduce the viscosities of the resins of the present invention.

Also phenoxy resins can be used as the film former polymer. A suitable phenoxy polyol resin is available under the trade name "PKHC", formerly available from Union Carbide Corporation, now available from Phenoxy Resin Associates.

Epoxy compounds are included in the resin compositions of the invention in an amount of from about 15 to 95% by wt., preferably from about 25 to 75% by wt. of the total content of the polymerizable components of the composition.

Suitable polyolefinically unsaturated components of the compositions may include poly(meth)acrylic resins, polyvinyl monomers, and polyunsaturated polyesters solubilized in vinyl monomers. As used herein, the term "(meth)acrylic" is intended to be broadly construed to include acrylic as well as methacrylic compounds, e.g., acrylic esters and methacrylic esters.

In addition, the polyolefinically unsaturated monomer component may comprise one or more low viscosity monoolefinically unsaturated monomers as diluent, but in any event, the olefinically unsaturated monomer component typically comprises at least one polyolefinically unsaturated monomer. As used herein, "polyolefinically unsaturated" means having at least two olefinic double bonds. The polyolefinically unsaturated monomers may be used in amounts of from about 5 to 30% and preferably from about 15 to about 25% by weight of the composition based upon the total content of the polymerizable components of the composition.

Polyacrylates are generally useful, including 1,3-butylene glycol diacrylate, diethylene glycol diacrylate, 1,6-hexanediol diacrylate, neopentylglycol diacrylate, polyethylene glycol diacrylate, tetraethylene glycol diacrylate, methylene glycol diacrylate, pentaerythritol tetraacrylate, tripropylene glycol diacrylate, ethoxylated bisphenol A diacrylate, trimethylolpropane triacrylate, di-trimethylolpropane tetraacrylate, dipenterythritol pentaacrylate, pentaerythritol triacrylate and the corresponding methacrylate compounds. Also useful are reaction products of (meth)acrylic acid and epoxide resins and urethane resins. Some typical photocurable reaction products of monoethylenically unsaturated acid such as acrylic or methacrylic acid and various epoxides are those disclosed in U.S. Pat. Nos. 4,169,732; 3661,576; 3,989,610; 3,772,062; 3,912,670; 3,450,613; 4,003,877; 4,014,771 and 4,237,216, disclosures of which are incorporated herein by reference. Other suitable poly(meth)acrylic ester compounds are also described in U.S. Pat. Nos. 4,051,195; 2,895,950; 3,218,305 and 3,425,988.

Useful (meth)acrylic resins include esters and amides of (meth)acrylic acid as well as comonomers thereof with other copolymerizable monomers. Illustrative esters include methyl acrylate, methyl methacrylate, hydroxyethyl acrylate, butyl methacrylate, octyl acrylate, and 2-epoxyethylacrylate.

Another class of resins which are actinic radiation curable and potentially suitable for use in the compositions in the invention include vinyl monomers such as styrene, vinyl toluene, vinyl pyrrolidone, vinyl acetate, divinyl benzene, and the like.

A further useful class of actinic radiation curable resin materials comprises unsaturated polyesters, solubilized in vinyl monomers, as ordinarily prepared from alpha-beta ethylenically unsaturated polycarboxylic acids and polyhydric alcohols, as described for example in U.S. Pat. No. 4,025,407.

Preferred polyolefinically unsaturated components include trimethylolpropane trimethacrylate, triethylolpropane triacrylate, dipentaerythritol pentaacrylate, pentaerythritol triacrylate, ethoxylated trimethylolpropane triacrylate, 1,6-hexanediol diacrylate, neopentyl glycol diacrylate, pentaerythritol tetraacrylate, and 1,3-butylene glycol diacrylate. Preferred monoacrylates include cyclohexylacrylate, 2-ethoxyethyl acrylate, 2-methoxy acrylate, benzoyl acrylate, and isobornyl acrylate. Such compounds are available from a variety of sources. For example, a preferred polyacrylate, dipentaerythritol monohydroxypentaacrylate, is available as SR 399 from Sartomer Co.

Actinic radiation means electromagnetic radiation having a wavelength of about 700 nm or less which is capable, directly or indirectly, of curing the specified resin component of the resin composition. By indirect curing in this context is meant curing under such electromagnetic radiation conditions, as initiated, promoted, or otherwise mediated by another compound.

Accordingly, a photoinitiator may be added to the composition in an amount effective to respond to the actinic radiation and to initiate and induce curing of the associated resin, via substantial polymerization thereof. Suitable photoinitiators useful with ultraviolet (UV) actinic radiation curing mono- and polyolefinic monomers include free radical generating UV initiators such as benzophenone and substituted benzophenones, acetophenone and substituted acetophenones, benzoin and its alkyl esters and xanthone and substituted xanthones. Preferred photoinitiators include diethoxy-acetophenone, benzoin methyl ether, benzoin ethyl ether, benzoin isopropyl ether, diethoxyxanthone, chlorothio-xanthone, azo-bisisobutyronitrile, N-methyl diethanolaminebenzophenone, and mixtures thereof.

Suitable photo-initiators and sensitizers include cationic initiators which typically generate a Bronsted acid upon exposure to actinic light. Examples of some suitable cationic photo-initiators which generate a Bronsted acid include onium salts and especially group VIA and group VIIA salts such as beryllium, selenonium, sulfonium and iodonium salts. Various suitable photo-initiators are discussed in U.S. Pat. Nos. 4,161,478; 4,442,197; 4,139,655; 4,400,541; 4,197,174; 4,173,476 and 4,299,938, disclosures of which are incorporated herein by reference.

Also see Watt, et al., "A Novel Photoinitiator of Cationic Polymerization: Preparation and Characterization of Bis [4-(diphenylsulfonio)phenyl]-sulfide-Bis-Hexafluorophosphase", Journal of Polymer Science: Polymer Chemistry Edition, Vol. 22, p. 1789 (1980), John Wiley & Sons, Inc.

Additional discussions concerning sulfonium and iodonium salts can be found, for instance, in Crivello, et al., "Complex Triarylsulfonium Salt Photoinitiators. II. The Preparation of Several New Complex Triarylsulfonium Salts and the Influence of Their Structure in Photoinitiated Cationic Polymerization", Journal of Polymer Science: Polymer Chemistry Edition, Vol. 18, pp. 2697–2714 (1980), John Wiley & Sons, Inc.; Pappas, et al., "Photoinitiation of Cationic Polymerization. III. Photosensitization of Diphenyliodonium and Triphenylsulfonium Salts", Journal of Polymer Science: Polymer Chemistry Edition, Vol. 22, pp. 77–84 (1984), John Wiley & Sons, Inc.; Crivello, et al., "Photoinitiated Cationic Polymerization with Triarylsulfonium Salts", Journal of Polymer Science: Polymer Chemistry Edition, Vol. 17, pp. 977–999 (1979), John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators", Journal of Polymer Science: Polymer Chemistry Edition, Vol. 18, pp 2677–2695 (1980), John Wiley & Sons, Inc.; and Crivello, "Cationic Polymerization-Iodonium and Sulfonium Salt Photoinitiators", Advances in Polymer Science, Series #62, pp. 1–48 (1984), Springer-Verlag.

The preferred photoacid generators or initiators are triflic acid generators and substituted and unsubstituted diaryl and triarylsulfonium and iodonium salts.

Compounds that generate triflic acid include onium salts such as diphenyl-iodonium triflate, di-(t-butyl phenyl) iodonium triflate and triphenylsulfonium triflate and non-ionic compounds such as phthalimide triflate.

Mixtures of diphenyl-iodonium triflate, di-(t-butyl-phenyl)iodonium triflate, or phthalimide triflate can be used.

Aromatic iodonium salts which can be employed in accordance with this invention thus include those having the formulae:

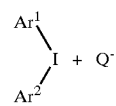

wherein

Ar$^1$ and Ar$^2$ are aromatic groups having 4 to 20 carbon atoms and are preferably selected from phenyl, naphthyl, thienyl, and furanyl groups; and Q$^-$ is any anion, but preferably is an anion selected from tetrafluoroborate, hexafluorophosphate, hexafluoroarsenate, hexafluoroantimonate, trifluoromethanesulfonate or trifluoroacetate.

Among the useful iodonium salts are particularly included:

diphenyliodonium hexafluoroarsenate
diphenyliodonium hexafluoroantimonate
diphenyliodonium hexafluorophosphate
diphenyliodonium trifluoroacetate
4-trifluoromethylphenylphenyliodonium tetrafluoroborate
ditolyliodonium hexafluorophosphate
di(4-methoxyphenyl)iodonium hexafluoroantimonate
diphenyliodonium trifluoromethane sulfonate
di(t-butylphenyl iodonium hexafluoroantimonate
di(t-butylphenyl iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate 2,2'-diphenyliodonium hexafluorophosphate.

A suitable complex triarylsulfonium hexafluoroantimonate salt photoinitiator formerly available under the trade name "VVE 1014" from General Electric Company is now available as "VVI 6974" from Union Carbide Company.

Other curing agents useful in the energy polymerizable compositions of the present invention comprise an organometallic compound having metal atoms selected from the elements of Periodic Groups IVB (Ti, Zr, Hf), VB (V, Nb, Ta), VIB (Cr, Mo, W), VIIB (Mn, Tc, Re) and VII (Fe, Ru, Os, Co, Rh, Ir, Ni, Pd, Pt) which are commonly referred to as transition metals.

Visible light initiators include camphoroquinone peroxyester initiators and 9-fluorene carboxylic acid peroxyesters. Particularly preferred photoinitiators include 2-hydroxy-2-methyl-1-phenyl-propan-1-one available as Darocur 1173 from EM Industries, Inc., and 2-benzyl-2-(dimethylamino)-1-[4-(4-morpholinyl)phenyl]-1-butanone available as Irgacure 369 and Irgacure 261 from Ciba.

The photoinitiator employed is present in an amount sufficient to initiate the photochemical reaction. Usually the amount of photoinitiator is about 0.1 to about 10 percent by weight and preferably about 0.4 to about 1.0 percent by weight based upon the weight of the resin composition on a dry basis.

Compositions employed according to the present invention also typically include an organic peroxide. Useful peroxides include various peroxyesters such as a-cumyl-peroxy-neodecanoate, 1,1-dimethyl-3-hydroxy-butylperoxyneodecanoate, a-cumylperoxyneoheptanoate, t-amyl-peroxyneodecanoate, t-butylperoxyneodecanoate, t-amyl-peroxyneodecanoate, t-butylperoxyneodecanoate, t-amyl-peroxypivalate, t-butylperoxypivalate, 1,1-dimethyl-3-hydroxy-butylperoxy-2-ethylhexanoate, 2,5-dimethyl-2,5-di(2-ethylhexanoylperoxy) hexane, t-amylperoxy-2-ethylhexanoate, t-butylperoxy-2-ethylhexanoate, t-butylperoxyisobutyrate, t-butylperoxymaleic acid, t-butylperoxyacetate, t-amylperoxyacetate and t-amylperoxy-benzoate.

Preferred organic peroxides include lauroyl peroxide, t-amylperoxy-2-ethylhexanoate and 1,1-di(butylperoxy)-3,3,5-trimethylhexane. Lauroyl peroxide is available as Alperox-F, t-amylperoxy-2-ethylhexanoate is available as Lupersol 575; and 1,1-di(t-butylperoxy)-2,2,5-trimethylhexane is available as Lupersol 256, all available from Elf Atochem North America, Inc.

Organic peroxides are generally present in the compositions of the invention in an amount of from about 0.2 to about 2 by weight based upon the resin composition.

Catalysts suitable in practicing preferred aspects of the present invention include heat activated catalysts capable of accelerating curing of the cyanate resin component. Examples of such catalysts include organo-metal compounds such as lead naphthenate, lead stearate, zinc naphthenate, zinc octylate, tin oleate, stannous laurate, dibutyltin maleate, manganese naphthenate, cobalt naphthenate, acetylacetonate iron, etc.; inorganic metal salts such as SnCl$_3$, ZnCl$_2$ and AlCl$_3$; phenolic compounds such as phenol, xylenol, cresol, resorcinol, catechol and fluoroglycine; and solutions of an organo-metal component including one or more organo-metal compounds, in a phenolic component.

In this preferred embodiment, the organo-metal component may be present in an amount of from about 0.0% to about 1.0% of the resin composition on a solids basis. The phenolic component may be present in the resin composition in amounts ranging from about 0.5 to about 10 by weight on a solids basis.

Preferred organo-metal salts include copper(II) acetyl acetonate, copper(II) naphthenate, cobalt(II) acetylacetonate, zinc(II) naphthenate, zinc(II) ethylhexanoate, manganese(II) naphthenate, and cyclopentadienyl iron(II) dicarbonyl dimer. Each of these organo-metal salts is readily available from various sources, for example Strem Chemical Corp., Newburyport, Mass. Other preferred organo-metal salts include dibutyltin(IV) dilaurate, available from Atochem North America, Inc., Buffalo, N.Y.

Preferred phenolic compounds include nonyl phenol, bisphenol A, cresol, phenol, and catechol, each of which is readily available from various sources, including Aldrich Chemical Co., Milwaukee, Wis.

In addition, the composition can contain 0–80% by weight of a filler. The filler can be electrically conductive and/or non-conductive. When employed, the preferred amount of filler is about 40 to about 80% and most preferably about 45 to about 60% by weight based upon the total weight of the resin composition. Suitable fillers include ceramic fillers such as aluminum oxide, 92% alumina, 96% alumina, aluminum nitride, silicon nitride, silicon carbide, beryllium oxide, boron nitride, silicas, silicates, quartz and diamond powder. Electrically conductive fillers include copper, silver, nickel, molybdenum, gold, palladium, platinum, aluminum powder and mixtures. Typically, the fillers have an average particle size of about 0.1 to about 75 microns, more typically about 0.5 to about 25 microns, and preferably about 0.5 to about 15 microns.

Optionally a surfactant, such as for example a non-ionic surfactant is employed. Preferably the surfactant is a fluorinated polyether. A suitable surfactant is available under the trade name "FC-430 Surfactant" from 3M Company.

The preferred compositions employed in the present invention comprise 1) a resin component comprising:
   a. an epoxy component including at least one polyepoxide resin curable by heat in an amount of about 25 to about 75% by weight,
   b. an olefinically unsaturated monomer component including at least one polyolefinically unsaturated monomer curable by actinic radiation in an amount of about 5 to about 30% by weight; and
   c. at least one cyanate ester in an amount of about 10 to about 50% by weight;
   d. at least a flexibilizer in the amount of 5–15% by weight on resin;
2) at least one photoinitiator in an amount of about 0.1 to about 10% by weight of the resin component;
3) at least one organic peroxide in an amount of about 0.2 to about 2% by weight of the resin component;
4) at least one heat activated curing agent for accelerating reaction of said cyanate ester, epoxy and combination thereof, said heat activated curing agent being selected from the group consisting of organo-metal compounds, inorganic metal salts, phenolic compounds, solutions of organo-metal compounds in phenolic compounds and mixtures thereof in an amount of about 0.01 to about 1.0% by weight of the resin component; and
5) a filler in an amount of about 40 to about 80% by weight based upon the resin component.

According to preferred aspects of the present invention, first a liquid or paste composition is prepared by combining the epoxy resins, and photoinitiators and solvent and mixing thoroughly. Solvent is employed to permit thorough mixing. Alternatively, various components are premixed in batch form. When employing silica or other fillers, the composition requires sufficient mixing to evenly disperse the silica. Suitable mixers include for example, vacuum high shear dispersion mixers.

The film is prepared by coating a liquid or paste onto a support, preferably a polymeric support, such as a polyester. Suitable polyester supports for the film include, for example, polyethylene terephthalate available under the trade name MYLAR® from DuPont and MELINEX from ICI. The film is applied to the polymeric support in liquid form or paste form, using conventional application methods such as, for example, curtain coating, screen coating, roller coating or spray coating. Good results have been obtained using about a 1 to 4 mil thick film.

The hole fill film is thermally stable, particularly at lamination temperatures preferably up to at least 125° C. for 1 hour. The hole fill film is also thermally stable at electroless bath temperatures. Typically, copper electroless plating baths have a pH of at lest 11, and a temperature of at least about 70° C. A typical bath contains a caustic agent typically, sodium hydroxide, formaldehyde and a copper source such as copper sulfate. Typically gold electroless plating baths have a pH of about 14, and a temperature of about 70° C. The gold bath typically contains dimethyl amino borane and caustic agents.

The hole fill films of the preferred embodiment withstands gold electroless plating bath conditions at pH 14, at least 60° C. for 45 minutes and withstands copper electroless plating bath conditions at pH 11, at least 73° C. for 10 hours.

The photocurable fill composition is coated as a relatively thin layer, for example from about 0.5 mil to about 6 mils thick, on a carrier film. The film thickness is tailored to accommodate the aspect ratio and density of the plated through-holes. Suitable carrier film include synthetic polymers such as polyesters, an example being Mylar.

After coating, the thin layer is dried to form an easy to handle tack-free sheet.

Next, the composite, a multilayer printed circuit board, with copper foil on its external surfaces, is drilled in the usual manner with the pattern of plated through-holes in the printed circuit board.

Thereafter, the through-holes are activated or seeded and plated with an electrically conductive metal using any of the many known processes for making plated through-holes in printed circuit boards.

Thereafter, a sheet of the carrier film coated with the photocurable fill composition is placed over the printed circuit board with the coated side facing the printed circuit board.

As an alternative for higher aspect ratio plated through-holes such as those having an aspect ratio of at least 10 that may be more difficult to fill, a coated sheet on each side of the printed circuit board can be used. The coated carrier, and the printed circuit board are placed in the opening of a vacuum laminating press. The press cycle of the vacuum laminating press is activated, which results in air being removed from the stack of the coated carrier, and the printed circuit board, especially from within the plated through-holes to be filled, and pressure and heat are applied. The heat causes the viscosity of the photocurable film material to decrease to a point where it will flow, under the force of the applied pressure, into the plated through-holes. The heating is continued until the time and temperature cycle required to obtain a complete fill in the plated through-holes. Typically, the temperature is about 110° C. to about 140° C. and more typically about 115° C. to about 125° C. Typically, the pressure is about 150 to about 700 and more typically about 300 to about 500 psi.

The vacuum laminating press is permitted to cool and the printed circuit boards with the filled plated through-holes are removed.

Next, the printed circuit boards are exposed imagewise through a mask having a pattern that permits light to pass through all or only on those holes desired to be filled. The actinic radiation is preferably ultraviolet light radiation of energies ranging from about 100 to 250 millijoules/$cm^2$ and more typically about 500 to about 3000 millijoules/$cm^2$. The exposure time is typically about 1 min. to about 5 min. and more typically about 2 min. to about 3 min.

The printed circuit boards are then developed using a solvent for that portion of the photocurable composition not exposed to the actinic light. Suitable solvents include butyrolactone, propylene carbonate, benzyl alcohol and mixtures thereof.

Additional processing is however desirable to make the printed circuit board ready for circuitization. For example, the plated through-hole fill process has raised nubs of film material at each of the filled plated through-holes. The nubs should be removed before circuitization. This can be accomplished by surface abrasion such as by chemical mechanical polishing. Optionally, known printed circuit board hole clean processes can be used to etch any excess photocurable composition that might have remained in the plated through-holes not to be filled.

In order to facilitate electrical connection as well as the formation of a solder cap atop the filled plated through-holes, the printed circuit board panel can be overplated with a thin layer of metal, such as copper. The copper overplate provides electrical conductivity for additive circuitization and solderability. The printed circuit board panel, with filled, plated through-holes can now be circuitized.

The process of the present invention is especially advantageous when it is combined with the surface laminar carrier (SLC) technology or build up technology. SLC adds additional dielectric and circuitry layers on one or both sides of a standard printed circuit board, with filled or unfilled plated through-holes. The build-up dielectric is processed using either photolithographic techniques, laser ablation or plasma etching, either direct photo-imaging or added photoresist plus etching, to make small, blind vias. Metal is plated and patterned on the surface of the SLC or build-up dielectric, using known electroless and/or electroplating and circuit patterning processes to simultaneously make the circuitry on top of the SLC or build-up dielectric and connections through the blind vias (photovias) to the underlying circuitry. It is the small size and precision location of the photovias that gives SLC or build-up its high density wiring capability, which is usually useful for fanning out very fine pitch SMCs.

The use of filled plated through-holes with SLC or build-up allows the circuitry on top of the SLC or build-up dielectric to be run over the top of the filled plated through-holes in the underlying card. This makes additional area available for wiring, thus increasing wiring density over that achieved with build-up or SLC without filled plated through-holes. The ability to have unfilled plated through-holes allows the use of PIH components such as connectors.

By using the process of the present invention for selective plated through-hole filling and SLC, it is possible to achieve fine line (dense) circuitry on the base PCB (subcomposite) and have selective or non-selective hole filling on the same SLC printed circuit board.

The following describes a suitable process sequence to achieve these objectives. In particular, a printed circuit board is laminated with foil such as copper foil on the external surfaces, using well known methods.

The foil on the surface of the printed circuit board subcomposite may optionally be thinned at this time in order to facilitate later etching of fine line circuitry. Through-holes which are to be plated are now drilled followed by cleaning of the holes. The through-holes are activated and plated along with the surfaces of the printed circuit board using any of the well known processes for plated through-holes, plating the barrels of the plated through-holes to their full required thickness.

Next, the coated carrier, coated with the photocurable film material, is placed over the printed circuit board with the fill composition facing the printed circuit board. Optionally, a second film on the opposite side of the printed circuit board can be provided to facilitate the filling of high aspect ratio holes.

One or more of the prepared stacks of printed circuit boards and coated carrier film are placed into the opening of a vacuum laminating press. The press cycle of the vacuum laminating press is activated, which results in air being removed from the stack of the coated carrier, and the printed circuit board. The heat causes the film material to flow through the holes into the plated through-holes under the force of the applied pressure.

The printed circuit boards with the filled plated through-holes are removed from the laminating press. The structure is then imagewise exposed through a mask having a pattern that allows light to pass through on all or only on those holes needed to be filled. The printed circuit boards are then developed using a solvent as discussed above to remove those portions of the photocurable composition that have not been exposed from the holes that are not to be filled. Nubs remaining from the process are abrasively and/or chemically removed. The surface is then cleaned such as by known methods in the PCB industry and prepared for circuitization. The printed circuit board subcomposite is then circuitized using well known print and etch methods for fine line circuitry.

Next, apply the SLC or build up dielectric materials such as resin coated copper to one or both sides of the circuitized subcomposite. The dielectric is then photoprocessed (for example dot etch, laser or plasma for the resin coated technology) to make photovias where connections are desired between the existing subcomposite circuitry and that to be formed on top of the dielectric layers. Photovias must be formed concentric to and larger than all of the unfilled plated through-holes. Photovias may also be formed over filled plated through-holes where this is advantageous for circuit design.

The surface of the SLC dielectric is then treated to improve the adhesion of the circuitry to be formed on it if needed. The surface of the SLC dielectric is activated and circuitized. For instance, circuitization can be accomplished by full panel plating and subtractive etching, making the surface conductive and pattern electroplating or pattern electroless plating.

The following non-limiting examples are presented to further illustrate the present invention.

EXAMPLE 1

A composition containing about 23.1 pbw LZ9302 resin 72% by wt solids in methyl ethyl ketone, 7.2 pbw ECN-1280, 0.3 pbw Z6040 silane coupling agent, 2 pbw phthalocyanine green of a solution of 6 pbw in 120 pbw in ERL-4221, 20 pbw of pentaerythritol triacrylate and 0.5 pbw 2-methyl-4-ethyl imidazole, 0.3 pbw Irgacure 651 are mixed to a homogeneous mixture. A small portion of this solution is applied with a wire rod (45) onto a 6 mil thick mylar and dried at 120 C./15 minutes. The coating thus produced is laminated onto a printed wiring board and imagewise exposed with a UV source from both sides of the fill, then heat cured at 140 C./30 minutes. The unexposed areas are then developed in benzyl alcohol at 80 C. for about 6 minutes. The holes exposed seen under the microscope appear to be filled with a nub concentric to the diameter of the filled hole. The unexposed areas are removed.

EXAMPLE 2

A composition containing about 19.1 pbw LZ 9302 resin 72% by wt solids in methyl ethyl ketone, 2.2 pbw cycloaliphatic eposide ERL-4221, 0.5 pbw Z6040 silane coupling agent, 3 pbw phthalocyanine green of a solution of 6 pbw in 120 pbw in ERL-4221, 2.0 pbw UVI-6974 and 20 pbw of quartz of 5 microns size are mixed to a homogeneous mixture. A small portion of this solution was applied with a wire rod onto a 6 mil thick mylar and dried at 130 C./10 minutes to form a 1.5 mil film. The coating thus produced is laminated onto a printed circuit board and imagewise exposed with a UV source from the opposite side of the fill, then heat cured at 130 C./60 minutes. The unexposed areas are then developed in benzyl alcohol at 80 C. for about 5 minutes. The board is then cured at 150 C. for 2 hrs. The holes exposed seen under the microscope appear to be filled on the side that was exposed.

EXAMPLE 3

A photoimageable composition is prepared having about 66.7 gr of PKHC from Phenoxy Associates, 80 gr of ERL-4221 from Union Carbide, 55.0 gr of Epon SU-8 from Shell Chemical, 100 gr of Epon-1183 from Shell Chemical, 3.6 gr of UVI-6974 from Union Carbide, 0.06 phr of Ethyl Violet from Aldrich. The solvent content consisting of methyl ethyl ketone, diethylene glycol monomethyl ether acetate, propylene glycol monomethyl ether acetate or combinations is typically greater than 30% and sufficient to provide a composition that is coated on a carrier film. The photoimageable composition is coated onto a 1.5 mil thick polyester film "Mylar D" from DuPont. The photoimageable composition is baked at 130° C. for 5 minutes to provide a 2.5 mil thick coating on the polyester carrier. The film is subsequently used in the hole fill operation. A panel is placed in a vacuum laminator so that the hole fill film is adjacent to a release sheet on either side of the panel with the hole fill material facing the panel and laminated at about 125° C., 300 psi pressure for about 30 minutes. The panel is then removed from the vacuum laminator and imagewise exposed to 2000 mj/cm$^2$ ultraviolet light through a film mask. The panel is then baked at 125° C. for about 30 minutes and developed in propylene carbonate. Next the hole fill is exposed to 4 J/cm$^2$ and baked at 180° C. for 1 hr. The remaining nubs are removed by mechanical sanding followed by chemical polishing. The resulting structure has completely filled through-holes.

EXAMPLE 4

A photoimageable composition is prepared having about 67.2 gr of PKHC from Phenoxy Associates, 81 gr of ERL-4221 from Union Carbide, 57.0 gr of Epon SU-8 from Shell Chemical, 100 gr of Epon-1183 from Shell Chemical, 3.6 gr of UVI-6974 from Union Carbide, 0.06 phr of Ethyl Violet from Aldrich and 380 gr of spherical silica (5000E-CP2) from Potters Industries. The solvent content consisting of methyl ethyl ketone, diethylene glycol monomethyl ether acetate, propylene glycol monomethyl ether acetate or combinations is typically greater than 30% and sufficient to provide a composition that is coatable onto a carrier film. The photoimageable composition is coated onto a 1.5 mil thick polyester film "Mylar D" from DuPont. The photoimageable composition is baked at 130° C. for 5 minutes to provide a 2.6 mil thick coating on the polyester carrier. The film is subsequently used in the hole fill operation as outlined in Example 3.

EXAMPLE 5

A photoimageable composition is prepared having about 33.4 gr of PKHC from Phenoxy Associates, 79 gr of ERL-4221 from Union Carbide, 56.0 gr of Epon SU-8 from Shell Chemical, 100 gr of Epon-1183 from Shell Chemical, 3.6 phr of UVI-6974 from Union Carbide, 0.2 phr of phthalocyanine green and 349 gr of silica 5000E-CP2 from Potters Industries. The solvent content consisting of methyl ethyl ketone, diethylene glycol monomethyl ether acetate, propylene glycol monomethyl ether acetate or combinations is greater than 30% and sufficient to provide a composition that is coatable onto a carrier film. The photoimageable composition is coated onto a 1.5 mil thick polyester film "Mylar D" from DuPont. The photoimageable composition is baked at 130° C. for 5 minutes to provide a 2.6 mil thick coating on the polyester carrier. The film is subsequently used in the hole fill operation as outlined in Example 3.

EXAMPLE 6

A photoimageable composition is prepared having about 300 pbw (parts by weight) Epon SU-8 from Shell Chemical, 100 pbw methyl amyl ketone, 20 pbw diisobutyl ketone, 300 pbw Novacup L337 from Malvern Minerals Co. (Arkansas) and 30 pbw UVI-6974. The photoimageable composition is coated onto a 6 mil thick polyester film from DuPont. The photoimageable composition is baked at 130° C. for 5 minutes to provide a 2.6 mil thick coating on the polyester carrier. The film is subsequently used in the hole fill operation as outlined in Example 3.

EXAMPLE 7

A photoimageable composition is prepared having about 67.2 gr of PKHC from Phenoxy Associates, 81 gr of ERL-4221 from Union Carbide, 57.0 gr of Epon SU-8 from Shell Chemical, 100 gr of Epon-1183 from Shell Chemical, 2.6 phr of CD-1012 from Sartomer, 0.2 phr of Orasol Blue GN from Ciba and 360 gr of Minusil 10 from U.S. Silica. The solvent content consisting of methyl ethyl ketone, diethylene glycol monomethyl ether acetate, propylene glycol monomethyl ether acetate or combinations is greater than 30% and sufficient to provide a composition that is coatable onto a carrier film. The photoimageable composition is coated onto a 1.5 mil thick polyester film "Mylar D" from DuPont. The photoimageable composition is baked at 130° C. for 5 minutes to provide a 2.3 mil thick coating on the polyester carrier. The film is subsequently used in the hole fill operation as outlined in Example 3.

EXAMPLE 8

A photoimageable composition is prepared having about 53.2 gr of PKHC from Phenoxy Associates, 81 gr of ERL-4221 from Union Carbide, 57.0 gr of Epon SU-8 from Shell Chemical, 100 gr of Epon-1183 from Shell Chemical, 15 gr of Arocy B-40S from Ciba, 2.6 phr of Irgacure 261 from Ciba, 0.2 phr of Orasol Blue GN from Ciba and 365 gr of Minusil 10 from U.S. Silica. The solvent content consisting of methyl ethyl ketone, diethylene glycol monomethyl ether acetate, propylene glycol monomethyl ether acetate or combinations is greater than 30% and sufficient to provide a composition that is coatable onto a carrier film. The photoimageable composition is coated onto a 1.5 mil thick polyester film "Mylar D" from DuPont. The photoimageable composition is baked at 110° C. for 10 minutes to provide a 2 mil thick coating on the polyester carrier. The film is subsequently used in the hole fill operation. A panel is placed in a vacuum laminator so that the hole fill film is adjacent to a release sheet on either side of the panel with the hole fill material facing the panel and laminated at about 125° C., 300 psi pressure for about 15 minutes. The panel is then removed from the vacuum laminator and imagewise exposed to 2000 jm/cm$^2$ ultraviolet light through a film mask.

The panel is then baked at 100° C. for about 30 minutes and developed in propylene carbonate. Next the hole fill is exposed to 4 J/cm$^2$ and baked at 180° C. for 1 hr. The remaining nubs are removed by mechanical sanding followed by chemical polishing. The resulting structure has completely filled through-holes.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A composition capable of filling vias comprising:
   1) a resin component comprising:
      a. an epoxy resin with an average epoxide group functionality around eight;
      b. a brominated epoxy resin, wherein the brominated epoxy resin is a diglycidyl ether of bisphenol A;
      c. a phenoxy polyol resin;
      d. an epoxy plasticizer; and
   2) at least one photoinitiator.

2. The composition of claim 1 further comprising at least one cyanate ester and at least one heat activated curing agent for accelerating reaction of the cyanate ester and the epoxy resin.

3. The composition of claim 2 wherein the heat activated curing agent is selected from the group consisting of organo-metal compounds, inorganic metal salts, phenolic compounds, solutions of organo-metal compounds in phenolic compounds and mixtures thereof.

4. The composition of claim 2, wherein the heat activated curing agent is present in an amount of about 0.0 1% to about 1.0% by weight of the resin component.

5. The composition of claim 1 further comprising a filler in an amount of about 40% to about 80% by weight of the epoxy resin.

6. A carrier film having a layer of the composition of claim 1 formed thereon.

7. The composition of claim 2 wherein at least one the cyanate ester comprises at least one compound having two or more —OCN functional groups.

8. The composition of claim 7, wherein the at least one cyanate ester compound is of Formula I.

wherein q can be an integer from 2 to 7 and wherein Z is a mono-, di-, tri-, or tetrasubstituted aromatic hydrocarbon containing 5 to 30 carbon atoms, or a mono-, di-, tri-, or tetrasubstituted aliphatic hydrocarbon containing 7 to 20 carbon atoms.

9. The composition of claim 7, wherein the at least one cyanate ester compound is of Formula II

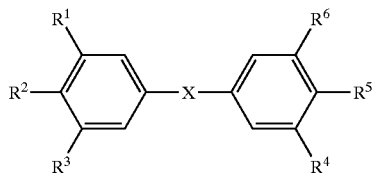

wherein x is a single bond, $(C_1-C_4)$alkylene, —S—, or —SO$_2$—; and $R^1$, $R^2$, $R^3$, $R^4$, $R^5$, and $R^6$ are independently H, $(C_1-C_3)$ alkyl, OCN, and at least two of $R^1$, $R^2$, $R^3$, $R^4$, $R^5$, and $R^6$ are OCN.

10. The composition of claim 7, wherein the at least one cyanate ester compound is of Formula III

III wherein n is 0 to 5.

11. The composition of claim 7 wherein the at least one cyanate ester compound is a dicyanate ester selected from the group consisting of bisphenol A, tetramethylbisphenol F, and bisphenol E.

12. The composition of claim 1 wherein the epoxy plasticizer is a cycloaliphatic epoxy resin.

13. The composition of claim 1 wherein the at least one photoinitiator is a triarylsulfonium hexafluoroantimonate salt.

14. The composition of claim 5 wherein the filler is selected form the group consisting of aluminum oxide, alumina, aluminum nitride, silicon nitride, silicon carbide, beryllium oxide, boron nitride, silicas, silicates, quartz, and diamond powder.

15. The composition of claim 5 wherein the filler is a electrically conductive filler selected from the group consisting of copper, silver, nickel, molybdenum, gold, palladium platinum and aluminum powder.

16. The composition of claim 5 wherein the filler has an average particle size from about 0.5 microns to about 25 microns.

17. The composition of claim 1 further comprising a surfactant.

18. A composition comprising:
   a resin component comprising:
      a. an epoxy resin with an average epoxide group functionality around eight in an amount of about 18% to about 21% by weight;
      b. a phenoxy polyol resin in an amount of about 12% to about 22% by weight;
      c. an epoxy plasticizer in an amount of about 25% to about 30% by weight; and
      d. a brominated epoxy resin in an amount of about 32% to about 38% by weight; wherein the percent by weights are of the total polymeric components in the composition; and
   at least one photoinitiator.

19. The composition of claim 18 wherein the epoxy resin with an average epoxide group functionality around eight is an octafunctional bisphenol A resin.

20. The composition of claim 18 wherein the brominated epoxy resin is a diglycidyl ether of bisphenol A.

21. The composition of claim 18 wherein the epoxy plasticizer is a cycloaliphatic epoxy resin.

22. The composition of claim 18 wherein the epoxy resin with an average epoxide group functionality around eight is an octafunctional bisphenol A resin.

* * * * *